(12) United States Patent
Yamaoka et al.

(10) Patent No.: US 12,095,227 B2
(45) Date of Patent: Sep. 17, 2024

(54) OPTICAL DEVICE

(71) Applicant: Nippon Telegraph and Telephone Corporation, Tokyo (JP)

(72) Inventors: Suguru Yamaoka, Tokyo (JP); Ryo Nakao, Tokyo (JP); Takaaki Kakitsuka, Tokyo (JP); Shinji Matsuo, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 400 days.

(21) Appl. No.: 17/617,116

(22) PCT Filed: Jun. 10, 2019

(86) PCT No.: PCT/JP2019/022876
§ 371 (c)(1),
(2) Date: Dec. 7, 2021

(87) PCT Pub. No.: WO2020/250268
PCT Pub. Date: Dec. 17, 2020

(65) Prior Publication Data
US 2022/0231480 A1    Jul. 21, 2022

(51) Int. Cl.
| | |
|---|---|
| *H01S 5/00* | (2006.01) |
| *H01S 5/02* | (2006.01) |
| *H01S 5/028* | (2006.01) |
| *H01S 5/065* | (2006.01) |
| *H01S 5/10* | (2021.01) |

(Continued)

(52) U.S. Cl.
CPC ............ *H01S 5/1028* (2013.01); *H01S 5/021* (2013.01); *H01S 5/028* (2013.01); *H01S 5/0657* (2013.01); *H01S 5/125* (2013.01); *H01S 5/2022* (2013.01); *H01S 5/2219* (2013.01);

(Continued)

(58) Field of Classification Search
CPC ........ H01S 5/1028; H01S 5/021; H01S 5/028; H01S 5/0657; H01S 5/125; H01S 5/2022; H01S 5/2219; H01S 5/3214; H01S 5/34306
See application file for complete search history.

(56) References Cited

U.S. PATENT DOCUMENTS

| | | | |
|---|---|---|---|
| 2013/0121362 A1* | 5/2013 | Kub | ....................... H01S 3/0813 372/50.22 |
| 2015/0063386 A1* | 3/2015 | Lin | .......................... G02B 6/12 372/34 |

(Continued)

OTHER PUBLICATIONS

Fujii et al. "Epitaxial growth of InP to bury directly bonded thin active layer on SiO2/Si substrate for fabricating distributed feedback lasers on silicon" IET Optoelectronics, 2015, vol. 9, Iss. 4, pp. 151-157.

(Continued)

*Primary Examiner* — Kinam Park
(74) *Attorney, Agent, or Firm* — Slater Matsil, LLP

(57) ABSTRACT

A device includes a first cladding layer, a waveguide laser, an absorption layer, and a second cladding layer. The absorption layer is constituted by an oversaturation absorption body such as graphene. Also, the absorption layer is provided between the active layer and the distributed Bragg reflection portion. The absorption layer is formed below a core forming an optical waveguide between the active layer and a distributed Bragg reflection portion.

11 Claims, 4 Drawing Sheets

(51) Int. Cl.
  *H01S 5/125* (2006.01)
  *H01S 5/20* (2006.01)
  *H01S 5/22* (2006.01)
  *H01S 5/32* (2006.01)
  *H01S 5/343* (2006.01)
  *H01S 3/063* (2006.01)

(52) U.S. Cl.
  CPC ........ *H01S 5/3214* (2013.01); *H01S 5/34306* (2013.01); *H01S 3/063* (2013.01)

(56) References Cited

U.S. PATENT DOCUMENTS

| | | | | |
|---|---|---|---|---|
| 2015/0108409 | A1* | 4/2015 | Meyer | H10K 85/6576 |
| | | | | 548/126 |
| 2018/0366907 | A1* | 12/2018 | Joseph | H01S 5/18344 |
| 2019/0165539 | A1* | 5/2019 | Schibli | H01S 3/0941 |

OTHER PUBLICATIONS

Kobayashi et al. "50-Gb/s Direct Modulation of a 1.3-μm InGaAlAs-Based DFB Laser With a Ridge Waveguide Structure," IEEE Journal of Selected Topics in Quantum Electronics, vol. 19, No. 4, Jul./Aug. 2013, 8 pages.

Wang et al., "Graphene on SiC as a Q-switcher for a 2 μm laser" Optics Letters, Feb. 2012, vol. 37, No. 3, pp. 395-397.

* cited by examiner

OPTICAL DEVICE

CROSS-REFERENCE TO RELATED APPLICATIONS

This application is a national phase entry of PCT Application No. PCT/JP2019/022876, filed on Jun. 10, 2019, which application is hereby incorporated herein by reference.

TECHNICAL FIELD

The present invention relates to an optical device, and in particular relates to an optical device including a waveguide semiconductor laser.

BACKGROUND

Si photonics is a technique for integrating an electronic circuit constituted by Si and an optical device on the same substrate using a CMOS technique. In this technique, an optical device that emits light is important, but since Si is an indirect band gap semiconductor, the light emission efficiency is very small, and it is difficult to use Si as an optical device that emits light.

In general, a III-V compound semiconductor such as GaAs or InP, which are a direct band gap type and have a high light emission efficiency, is used in an optical device that emits light. In view of this, for example, as an optical device that can be applied to Si photonics, a technique has been studied in which a III-V compound semiconductor is bonded to a Si substrate and a laser structure (a III-V on Si laser) is produced using the bonded III-V semiconductor (see NPL1). For example, hydrophilic bonding or surface activation bonding, which are well-known, is used in this kind of bonding of a silicon substrate and a III-V compound semiconductor. An insulating layer such as $SiO_2$ is used in the bond interface of the surface activation bond or hydrophilic bond, and enables bonding of the substrate via oxygen bonding of the bond interface (NPL1).

In a laser composed of a III-V compound semiconductor formed on an Si substrate, the refractive index of the Si substrate is higher than the refractive index of an upper-portion cladding medium, and is about the same as the refractive index of an active layer medium. Accordingly, in order to obtain high light confinement, it is necessary to set the distance between the active layer and the Si substrate composed of the III-V compound semiconductor on the order of several micrometers, and design the waveguide mode of the laser such that the refractive index of Si is not felt.

Incidentally, in the above-described laser structure, since the thermal conductivity of $SiO_2$ is small, a problem occurs in that heat generation in the active layer is not efficiently emitted to the Si substrate. The effect of the heat generation in the active layer appears as a reduction of the light output and saturation of the modulation speed, and causes the laser characteristics to deteriorate (NPL2).

In order to solve the above-described problems of light confinement and heat dissipation, it has been proposed that a laser is integrated on a substrate having a lower refractive index and a higher thermal conductivity than a core. For example, since a laser structure in which SiC, which has a higher thermal conductivity and a smaller refractive index than Si or InP, is used as a substrate can improve the heat dissipation property of the laser active layer and a greater amount of current than in the conventional technique can be injected, the realization of high light output and high speed modulation is expected.

Incidentally, a Q switch laser, with which higher-energy laser light is obtained, and a mode-locked laser, with which a long-short pulse laser is obtained, have been attracting attention. These optical devices use graphene as an oversaturation absorption body, and an external light source such as a fiber laser is used as the light source (see NPL3). Note that graphene is formed through epitaxial growth on a 6H-SiC (0001) substrate, a 4H-SiC (0001) substrate, and a 3C-SiC (111) substrate.

Citation List

Non Patent Literature

NPL1—T. Fujii et al., "Epitaxial growth of InP to bury directly bonded thin active layer on SiO2/Si substrate for fabricating distributed feedback lasers on silicon", IET Optoelectron, vol. 9, Iss. 4, pp. 151-157, 2015.

NPL2—W. Kobayashi et al., "50-Gb/s Direct Modulation of a 1.3-μm InGaAlAs-Based DFB Laser With a Ridge Waveguide Structure", IEEE Journal of Selected Topics in Quantum Electronics, vol. 19, no. 4, 1500908, 2013.

NPL3—Q. Wang et al., "Graphene on SiC as a Q-switcher for a 2 μm laser", Optics Letters, vol. 37, no. 3, pp. 395-397, 2012.

SUMMARY

Technical Problem

However, an optical device in which the above-described oversaturation absorption body is used is problematic in that size reduction is not easy since an external light source such as a fiber laser is used.

Embodiments of the present invention were made in order to solve the above-described problems, and aims to reduce the size of an optical device in which an oversaturation absorption body is used.

Means for Solving the Problem

An optical device according to embodiments of the present invention includes: a waveguide laser that is formed above a first cladding layer and includes an active layer constituted by an InP-based compound semiconductor; a reflection portion provided on one end of the active layer, which is an emission side of the waveguide laser; a distributed Bragg reflection portion provided on another end of the active layer of the waveguide laser; an absorption layer composed of an oversaturation absorption body provided between the active layer and the distributed Bragg reflection portion; and a second cladding layer that is formed on the first cladding layer and covers the waveguide laser, in which the first cladding layer is constituted by a material having a higher thermal conductivity than InP.

In an exemplary configuration of the above-described optical device, the absorption layer is formed below a core forming an optical waveguide between the active layer and the distributed Bragg reflection portion.

In an exemplary configuration of the above-described optical device, the absorption layer is formed above a core forming an optical waveguide between the active layer and the distributed Bragg reflection portion.

In an exemplary configuration of the above-described optical device, the first cladding layer is constituted by SiC.

In an exemplary configuration of the above-described optical device, the oversaturation absorption body is graphene.

Effects of Embodiments of the Invention

As described above, according to embodiments of the present invention, an absorption layer composed of an oversaturation absorption body is arranged between an active layer and a distributed Bragg reflection portion of a waveguide laser, and these are formed on a first cladding layer constituted by a material having a higher thermal conductivity than InP, and therefore it is possible to reduce the size of an optical device in which an oversaturation absorption body is used.

DETAILED DESCRIPTION OF ILLUSTRATIVE EMBODIMENTS

Figure 1A:
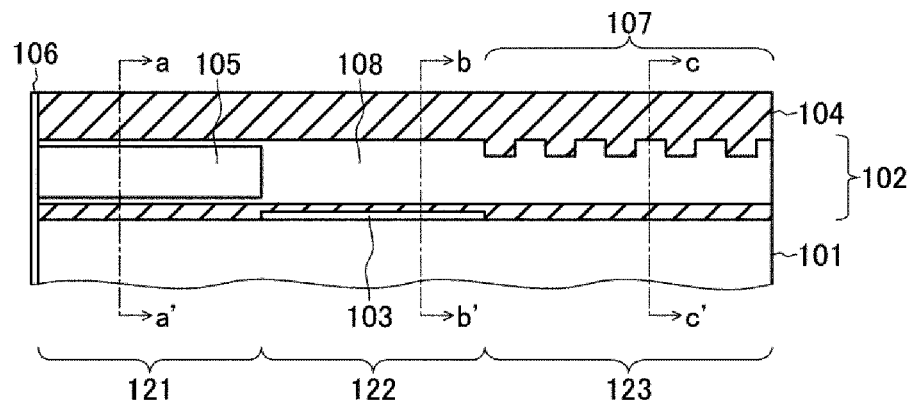
FIG. 1A is a cross-sectional view showing a configuration of an optical device according to an embodiment of the present invention.
Figure 1B:
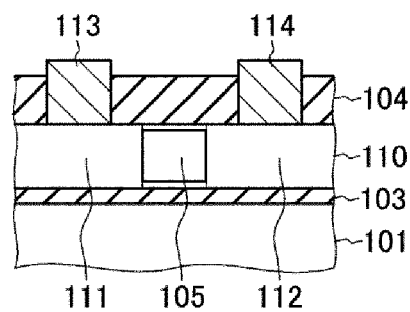
FIG. 1B is a cross-sectional view showing a configuration of an optical device according to an embodiment of the present invention.
Figure 1C:
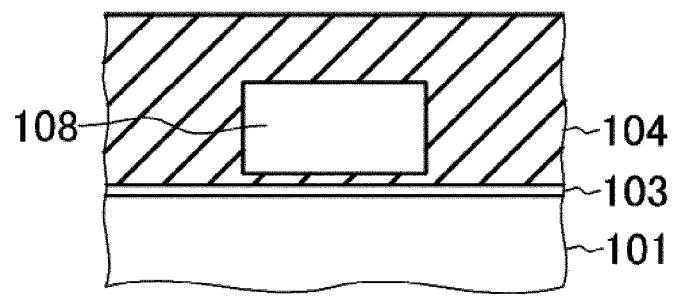
FIG. 1C is a cross-sectional view showing a configuration of an optical device according to an embodiment of the present invention.
Figure 1D:
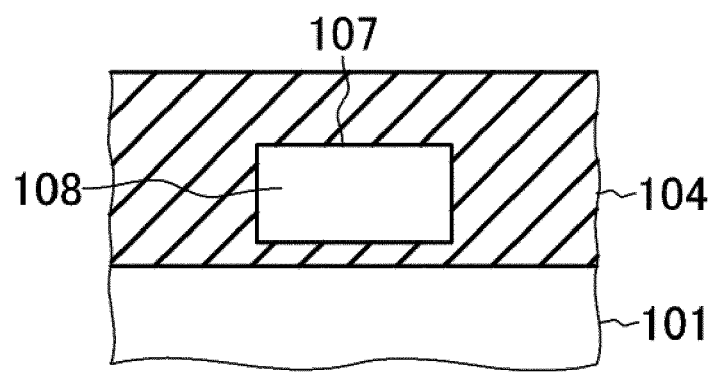
FIG. 1D is a cross-sectional view showing a configuration of an optical device according to an embodiment of the present invention.

Hereinafter, an optical device according to an embodiment of the present invention will be described with reference to FIGS. 1A, 1B, 1C, and 1D. Note that FIG. 1A shows a cross-section on a plane parallel to a wave guiding direction. Also, FIG. 1B shows a cross-section taken along line aa' in FIG. 1A, FIG. 1C shows a cross-section taken along line bb' in FIG. 1A, and FIG. 1C shows a cross-section taken along line cc' in FIG. 1A.

The optical device includes a first cladding layer 101, a waveguide laser 102, an absorption layer 103, and a second cladding layer 104.

The first cladding layer 101 is constituted by a material having a higher thermal conductivity than InP. For example, the first cladding layer 101 can be constituted by one of SiC, AlN, GaN, and diamond. These materials have lower refractive indices and larger thermal conductivities and band gaps than any material forming a later-described active layer 105. For example, the first cladding layer 101 can be produced through lithography/etching or the like of a substrate constituted by SiC, diamond, or the like, but the method of production does not matter. The first cladding layer 101 can be constituted by 6H-SiC in which the plane orientation of a main surface is a (0001) surface, 4H-SiC in which the plane orientation of a main surface is a (0001) surface, and 3C-SiC in which the plane orientation of a main surface is a (111) surface.

In the first region 121, the waveguide laser 102 includes an active layer 105 that is constituted by an InP-based compound semiconductor. Also, the waveguide laser 102 includes a reflection portion 106 that is provided on one end of the active layer 105 that is the emission side of the light (laser light), and a distributed Bragg reflection portion 107 that is arranged on another end of the active layer 105.

The active layer 105 is, for example, a double quantum well structure resulting from a well layer and a barrier layer composed of InGaAlAs, InGaAs, InGaAsP, and the like, which each have a different composition. The active layer 105 can also be formed by compound semiconductors such as bulk InGaAlAs, InGaAs, and InGaAsP. For example, the width of the active layer 105 can be 0.7 μm, and the thickness of the active layer 105 can be 0.32 μm. Note that there is no limitation on the layer structure and the width. The thickness 0.32 μm of the active layer 105 is the value of the approximate upper limit at which light of the wavelength 1.31 μm, which propagates in the active layer 105, is in a single mode with respect to the thickness direction of the active layer 105.

Also, the active layer 105 is, for example, embedded in the semiconductor layer 110 composed of InP. The semiconductor layer 110 on the upper side and the lower side of the active layer 105 is constituted by non-doped InP. Also, the semiconductor layer 110 on one side surface of the active layer 105 is a p-type region 111 constituted by p-type InP, and the semiconductor layer 110 on the other side surface of the active layer 105 is an n-type region 112 constituted by n-type InP. According to this p-i-n junction, a structure through which current is injected into the active layer 105 is formed. Also, a p electrode 113 is electrically connected to the p-type region in, and an n electrode 114 is electrically connected to the n-type region 112. The p electrode 113 can connect to the p-type region in via a p-type contact layer (not shown). Also, the n electrode 114 can connect to the n-type region 112 via an n-type contact layer (not shown).

The active layer 105 is formed continuously with a core 108. The core 108 is formed spanning over a second region 122, which is continuous with the first region 121, and a third region 123, which is continuous with the second region 122. The core 108 can be constituted by, for example, InP. Also, the distributed Bragg reflection portion 107 is constituted by a diffraction grating that is formed on the third region 123 of the core 108. The active layer 105 and the distributed Bragg reflection portion 107 are optically connected via the core 108 of the second region 122.

Also, the active layer 105 is, for example, a double quantum well structure resulting from a well layer and a barrier layer composed of InGaAlAs, InGaAs, InGaAsP, and the like, which each have a different composition. The active layer 105 can also be formed by compound semiconductors such as bulk InGaAlAs, InGaAs, and InGaAsP. For example, the width of the active layer 105 can be 0.7 μm, and the thickness of the active layer 105 can be 0.32 μm. Note that there is no limitation on the layer structure and the width. The thickness 0.32 μm of the active layer 105 is the value of the approximate upper limit at which light of the wavelength 1.31 μm, which propagates in the active layer 105, is in a single mode with respect to the thickness direction of the active layer 105.

Also, the active layer 105 is, for example, embedded in the semiconductor layer 110 composed of InP. The semiconductor layer 110 on the upper side and the lower side of the active layer 105 is constituted by non-doped InP. Also, the semiconductor layer 110 on one side surface of the active layer 105 is constituted by p-type InP, and the semiconductor layer 110 on the other side surface of the active layer 105 is constituted by n-type InP. According to this p-i-n junction, a structure through which current is injected into the active layer 105 is formed.

Incidentally, if the operating wavelength of the waveguide laser 102 or the material used as the active layer 105 is changed, in order to achieve a single mode in the thickness direction of the active layer 105, it is sufficient that the thickness t of the active layer 105 approximately satisfies the relationship shown in the following equation (1), where the operating wavelength is $\lambda$, the average refractive index of the active layer 105 is $n_{core}$, and the refractive index of the first cladding layer 101 is $n_{clad}$.

Equation 1

$$t < \frac{3}{2\pi} \frac{\lambda}{\sqrt{n_{core}^2 - n_{clad}^2}} \quad (1)$$

For example, if light of a wavelength in a 1.55 μm band is to be used, the thickness t of the active layer 105 is 0.364 μm or less.

The absorption layer 103 is constituted by an oversaturation absorption body such as graphene. Also, the absorption layer 103 is provided between the active layer 105 and the distributed Bragg reflection portion 107. In this example, the absorption layer 103 is formed below the core 108, which constitutes the optical waveguide between the active layer 105 and the distributed Bragg reflection portion 107 (second region 122). Graphene can be epitaxially grown on 6H-SiC, in which the surface orientation of the main surface is a (0001) surface, 4H-Sic, in which the surface orientation of the main surface is a (0001) surface, and 3C-SiC, in which the surface orientation of the main surface is a (111) surface. Note that the absorption layer 103 can also have a configuration of being arranged on the core 108, which forms the optical waveguide between the active layer 105 and the distributed Bragg reflection portion 107.

Also, the second cladding layer 104 is formed on the first cladding layer 101 and covers the waveguide laser 102. The second cladding layer 104 is constituted by, for example, $SiO_2$.

According to the optical device in the above-described embodiment, first, deterioration of output light resulting from self-heat generation of the waveguide laser 102 can be reduced due to the high heat dissipation ability of the first cladding layer 101 constituted by SiC or the like, and therefore high light output is expected. Also, lateral-direction current injection is enabled with a PIN structure formed by the p-type region 111 and the n-type region 112 sandwiching the active layer 105. Also, according to an embodiment, the light generated from the active layer 105 of the first region 121 is confined in the second region 122 by the distributed Bragg reflection portion 107 of the third region 123. Then, the absorption layer 103 is arranged on the second region 122. If the absorption layer 103 is constituted by graphene, in the optical device according to the embodiment, a Q switch or a mode-locking operation can be expected due to the oversaturation absorption property in the wavelength band 1 to 2 μm of graphene.

In the above-described optical device, the active layer 105, the core 108, and the semiconductor layer no can be formed using a well-known crystal growth technique. Also, the first cladding layer 101 can be formed using a substrate bonding technique or the like with a substrate on which the active layer 105 is formed, but there is no limitation to this production method. Also, in the embodiment, light confinement in the substrate horizontal direction is realized through a difference in the refractive indices of the active layer 105 and the semiconductor layer 110, and the waveguide gain. However, there is no limitation to this, and any method can be used to realize light confinement resulting from a two-dimensional photonic crystal structure and the like.

Next, the waveguide mode distribution of the optical device according to the embodiment will be described. Note that hereinafter, it is assumed that the first cladding layer 101 is constituted by SiC, and the second cladding layer 104 is constituted by SiO2. Also, the active layer 105 has a double quantum well structure resulting from a well layer and a barrier layer, which each have different compositions and are composed of InGaAlAs. Also, the semiconductor layer 110 on one side surface of the active layer 105 is a p-type region 111 constituted by p-type InP. Also, the semiconductor layer 110 on the other side surface of the active layer 105 is the n-type region 112 constituted by n-type InP. Also, the core 108 is InP. Also, the width of the active layer 105 is 0.7 μm, the thickness is 0.33 μm, the width of the core 108 is 1.2 μm, and the thickness is 0.33 μm.

Figure 2A:
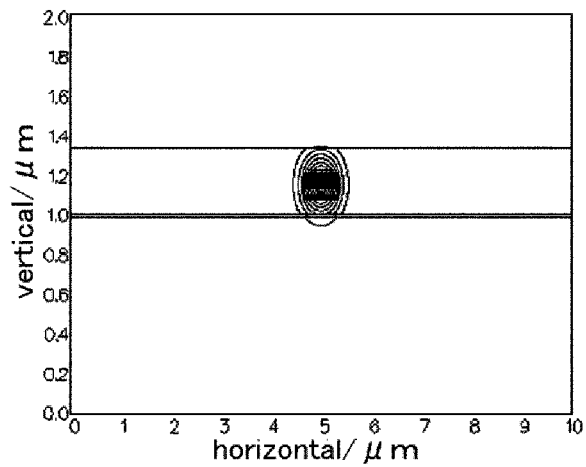
FIG. 2A is a feature diagram showing a waveguide mode distribution in the cross-section shown in FIG. 1B.
Figure 2B:
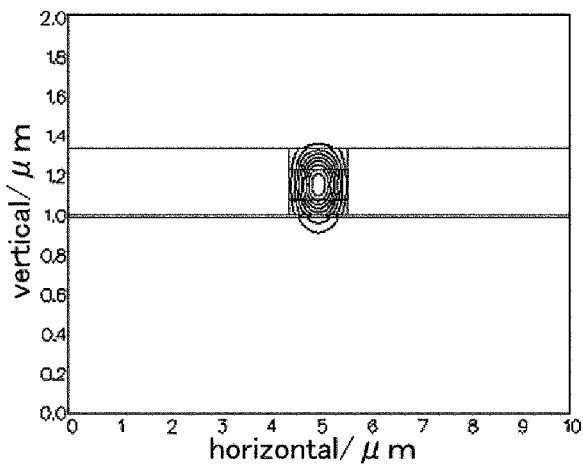
FIG. 2B is a feature diagram showing a waveguide mode distribution in the cross-section shown in FIG. 1C.
Figure 2C:
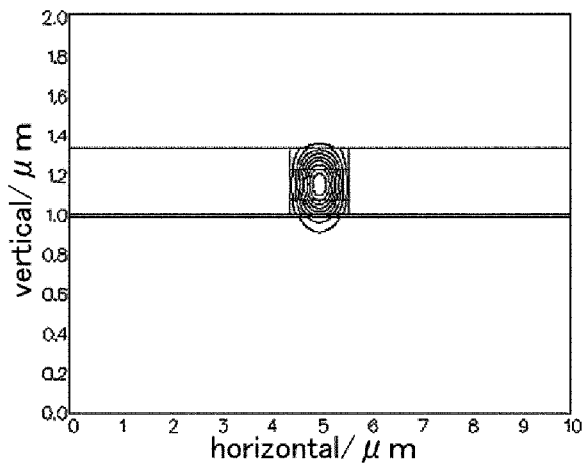
FIG. 2C is a feature diagram showing a waveguide mode distribution in the cross-section shown in FIG. 1D.

A waveguide mode distribution calculated based on the above-described configuration is shown in FIGS. 2A, 2B, and 2C. FIG. 2A shows a waveguide mode distribution in the cross-section shown in FIG. 1B of the first region 121. FIG. 2B shows a waveguide mode distribution in the cross-section shown in FIG. 1C of the second region 122. FIG. 2C shows a waveguide mode distribution in the cross-section shown in FIG. 1D of the third region 123. In FIGS. 2A, 2B, and 2C, the waveguide mode distributions are shown as contour lines.

Since an active layer with a high refractive index or an InP core is sandwiched between $SiO_2$ and SiC, which has a small relative refractive index, high light confinement is realized as shown in FIGS. 2A, 2B, and 2C. For this reason, in the second region 122, a high photon density is achieved using an optical waveguide structure with high light confinement and a small volume. This is useful for realizing oversaturation absorption in the absorption layer 103.

Figure 3:
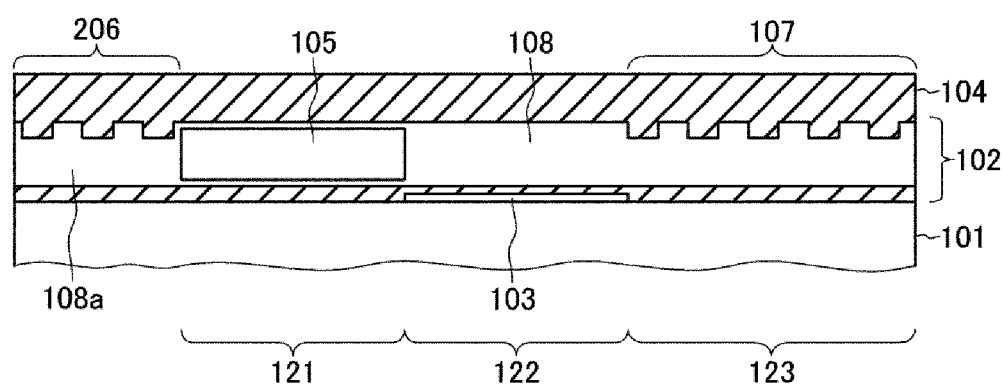
FIG. 3 is a cross-sectional view showing a configuration of another optical device according to an embodiment of the present invention.

Incidentally, the reflection portion provided on one end of the active layer 105, which is the emission side of the laser light, can be constituted by a distributed Bragg reflection portion 206 constituted by a diffraction grating, as shown in FIG. 3. For example, a core 108a, which is similar to the core 108, can be formed also on one end of the active layer 105, and a diffraction grating can be formed above the core 108a to form the distributed Bragg reflection portion 206.

As described above, according to embodiments of the present invention, an absorption layer composed of an oversaturation absorption body is arranged between an active layer and a distributed Bragg reflection portion of a waveguide laser, and these are formed on a first cladding layer constituted by a material having a higher thermal conductivity than InP, and therefore it is possible to realize a reduction in size of an optical device using an oversaturation absorption body. According to the present invention, it is possible to integrate a waveguide semiconductor laser having a high heat dissipation ability and a waveguide structure including an oversaturation absorption body.

Note that the present invention is not limited to the embodiment described above, and it is clear that many modifications and combinations can be implemented by a person with normal knowledge in the relevant field, within the technical idea of the present invention.

REFERENCE SIGNS LIST

101 First cladding layer
102 Waveguide laser
103 Absorption layer
104 Second cladding layer
105 Active layer
106 Reflection portion
107 Distributed Bragg reflection portion
108 Core
110 Semiconductor layer
111 p-type region
112 n-type region
113 p electrode
114 n electrode
121 First region
122 Second region
123 Third region.

The invention claimed is:

1. An optical device comprising:
a waveguide laser above a first cladding layer, the waveguide laser including an active layer comprising an InP-based compound semiconductor;
a reflection portion provided on a first end of the active layer of the waveguide laser, the first end of the active layer being an emission side of the waveguide laser;
a distributed Bragg reflection portion provided on a second end of the active layer of the waveguide laser;
an absorption layer composed of an absorption body between the active layer and the distributed Bragg reflection portion; and
a second cladding layer on the first cladding layer and covering the waveguide laser, wherein a thermal conductivity of a material of the first cladding layer is greater than a thermal conductivity of an InP material.

2. The optical device according to claim 1, wherein the absorption layer is below a core forming an optical waveguide between the active layer and the distributed Bragg reflection portion.

3. The optical device according to claim 1, wherein the absorption layer is above a core forming an optical waveguide between the active layer and the distributed Bragg reflection portion.

4. The optical device according to claim 1, wherein the first cladding layer comprises a SiC material.

5. The optical device according to claim 1, wherein the absorption body is made of a graphene material.

6. An optical device comprising:
a waveguide laser above a first cladding layer, the waveguide laser including an active layer, the active layer being made of a compound semiconductor-based material;
a reflection portion provided on a first end of the active layer of the waveguide laser, the first end of the active layer being an emission side of the waveguide laser;
a distributed Bragg reflection portion provided on a second end of the active layer of the waveguide laser;
an absorption layer composed of graphene between the active layer and the distributed Bragg reflection portion; and
a second cladding layer on the first cladding layer and covering the waveguide laser, wherein a thermal conductivity of a material of the first cladding layer is greater than a thermal conductivity of a compound semiconductor of the compound semiconductor-based material.

7. The optical device of claim 6, wherein the compound semiconductor is a InP material.

8. The optical device of claim 7, wherein the compound semiconductor-based material is a InGaAlAs, InGaAs, or InGaAsP material.

9. The optical device according to claim 6, wherein the absorption layer is below a core forming an optical waveguide between the active layer and the distributed Bragg reflection portion.

10. The optical device according to claim 6, wherein the absorption layer is above a core forming an optical waveguide between the active layer and the distributed Bragg reflection portion.

11. The optical device according to claim 6, wherein the first cladding layer comprises a SiC material.

* * * * *